US011528041B2

(12) United States Patent
Verzola et al.

(10) Patent No.: US 11,528,041 B2
(45) Date of Patent: Dec. 13, 2022

(54) LC DISTRIBUTED MATCHING FOR EQUALIZED CROSS-SWITCH RF PERFORMANCE

(71) Applicant: Infineon Technologies AG, Neubiberg (DE)

(72) Inventors: Pierpaolo Verzola, Linz (AT); Stephan Leuschner, Linz (AT)

(73) Assignee: Infineon Technologies AG, Neubiberg (DE)

( * ) Notice: Subject to any disclaimer, the term of this patent is extended or adjusted under 35 U.S.C. 154(b) by 288 days.

(21) Appl. No.: 16/842,043

(22) Filed: Apr. 7, 2020

(65) Prior Publication Data

US 2021/0314006 A1 Oct. 7, 2021

(51) Int. Cl.
| | | |
|---|---|---|
| H04B 1/00 | (2006.01) | |
| H03H 7/38 | (2006.01) | |
| H01H 11/00 | (2006.01) | |
| H04L 25/03 | (2006.01) | |
| H04B 1/18 | (2006.01) | |

(52) U.S. Cl.
CPC ............ *H04B 1/006* (2013.01); *H01H 11/00* (2013.01); *H03H 7/38* (2013.01); *H04B 1/18* (2013.01); *H04L 25/03949* (2013.01)

(58) Field of Classification Search
CPC .......... H04B 1/006; H04B 1/18; H01H 11/00; H01H 7/38; H04L 25/03949
See application file for complete search history.

(56) References Cited

U.S. PATENT DOCUMENTS 2,771,585 A * 11/1956 De Long ................. H01F 19/00
333/32
5,488,566 A * 1/1996 Woolsey ................ G01B 7/023
324/207.11
9,515,632 B2 * 12/2016 Ishizuka ................. H01F 38/14

FOREIGN PATENT DOCUMENTS

JP 2003124027 A * 4/2003

* cited by examiner

*Primary Examiner* — Samuel S Outten
*Assistant Examiner* — Kimberly E Glenn
(74) *Attorney, Agent, or Firm* — Slater Matsil, LLP

(57) ABSTRACT

A method of manufacturing an RF switch includes adding a first mutual inductance portion to a first self-inductance portion of a first transmission line; and adding a second mutual inductance portion to a second self-inductance portion of a second transmission line, wherein values of the first and second mutual inductance portions and values of the first and second self-inductance portions equalize an impedance difference between the first transmission line and the second transmission line.

19 Claims, 13 Drawing Sheets

LC DISTRIBUTED MATCHING FOR EQUALIZED CROSS-SWITCH RF PERFORMANCE

TECHNICAL FIELD

The present invention relates generally to a system and method for LC distributed matching for equalized cross-switch RF performance.

BACKGROUND

The increasing complexity of RF front-ends in mobile devices (for example the increasing number of antennas used for transmission (TX) and receive (RX) paths in multiple-input, multiple output (MIMO) systems driven by new communication standards such as Advanced LTE and 5G) in turn drives the need for more complex RF switching devices. Simpler single-pole, dual throw (SPDT) switching devices may be replaced with more complex switching devices such as four-pole, four-throw (4P4T) switching devices, for example, that allow the connection of multiple paths from a transceiver to different antennas. The higher pole and throw count in such switching devices leads to a greater path-to-path variation of the associated RF performance, especially insertion loss, return loss and linearity. The path-to-path variation can lead to unbalanced device level RF performance where the worst performing switch path becomes limiting to the RF front-end and thus to the entire RF system.

SUMMARY

A method of manufacturing an RF switch includes adding a first mutual inductance portion to a first self-inductance portion of a first transmission line; and adding a second mutual inductance portion to a second self-inductance portion of a second transmission line, wherein values of the first and second mutual inductance portions and values of the first and second self-inductance portions are configured to equalize an impedance difference between the first transmission line and the second transmission line.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a multi-pole multi-throw cross-switch (or "crosspoint switch") such as an RF 4P4T switch. Embodiments of the present invention can also be applied to many other switches operating in other frequency ranges and having other switch configurations. In some embodiments, the cross-switch comprises transmission lines have a branch structure that are connected to cross-switch input/outputs and to individual switch cells. The branch structure transmission lines are configured to have mutual inductances and self-inductance portions that are used to equalize impedance differences between the transmission lines. In some embodiments, the mutual inductance portions are configured to have a compensation effect, and thus the impedance of the branched structure transmission line is primarily set by the self-inductance portions.

Embodiments of the present invention described below advantageously close the gap between best case and worst case RF path performance allowing a more balanced system design.

To date, off-chip (integrated in the package or external) simple matching elements have been used to optimize the performance of a single path or a group of paths in a cross-switch. It is an advantage of some embodiments that the branched structure of the transmission lines of the cross-switch can be used to match the impedance of all of the multiple switch paths. The impedance difference between the best switch path and the worst switch path in the cross-switch is therefore minimized, which leads to optimum switch performance.

Figure 1A:
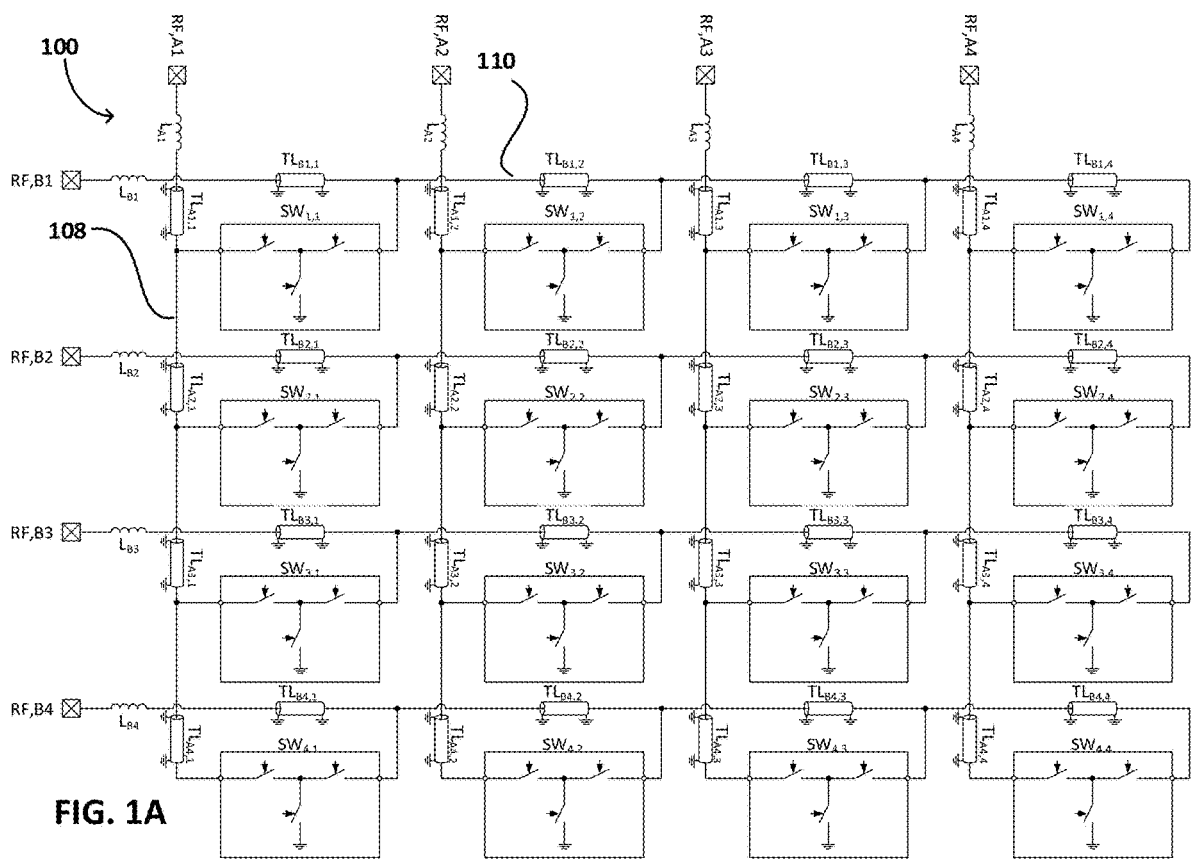
FIG. 1A is a schematic diagram of an exemplary RF cross-switch.

FIG. 1A shows a schematic diagram of an exemplary multi-pole multi-throw cross-switch 100 with "n" inputs and "m" outputs. In the 4P4T example of FIG. 1A, "n" is equal to four, and "m" is also equal to four. Due to the number of RF switch branches used to connect each input to each of the outputs the chip layout of the RF part becomes large, which in turn results in long connection lines for some selected paths. The switch branches are arranged in a matrix and connected by long, horizontal and vertical metal routing or traces, shown in FIG. 1A as transmission line elements $TL_{A/B,m,n}$ coupled to the individual switch cells $SW_{m,n}$. Each transmission line element includes series inductive and resistive elements, as well as parallel capacitive elements coupled to ground. Each transmission line element $TL_{A/B,m,n}$ can be represented by a lumped model that includes series inductive and resistive elements, as well as the parallel capacitive elements, which are not individually shown in FIG. 1A. The transmission line element symbol used herein is therefore meant to convey a transmission line element of a metal trace having the associated resistive, inductive, and/or capacitive elements, and not meant to convey a portion of a coaxial cable having shielding coupled to ground. The switch cells include a number of individual switches and are described in further detail below. Switch 100 also includes input/output nodes RF,Am coupled to the column transmission lines, and input/output (I/O) nodes RF,Bn coupled to the row transmission lines.

For example, a first column transmission line 108 associated with the RF,A1 node includes serial transmission line elements $TL_{A1,1}$, $TL_{A2,1}$, $TL_{A3,1}$, and $TL_{A4,1}$. For another example, a first row transmission line no associated with the RF,B1 node includes serial transmission line elements $TL_{B1,1}$, $TL_{B1,2}$, $TL_{B1,3}$, and $TL_{B1,4}$. The remaining row and column transmission lines include similar transmission line elements.

Each of the RF I/O nodes has one associated tuning inductor ($L_{A1}$, $L_{A2}$, $L_{A3}$, or $L_{A4}$ for each of the respective column transmission lines, and $L_{B1}$, $L_{B2}$, $L_{B3}$, or $L_{B4}$ for each of the row transmission lines) which is dimensioned to minimize insertion loss for all switch paths.

The implementation of switch 100 including one tuning inductor per transmission line is not optimal, which becomes apparent when comparing the inductance of the connection path between input/output RF,A1 and input/output RF,B1 (RF,A1→RF,B1) versus the inductance of the connection path between input/output RF,A1 and input/output RF,B4 (RF,A1→RF,B4):

Connection path RF,A1→RF,B1: The total inductance along this connection path is: $L_{A1}+L_{TLA1}+L_{TLB1}+L_{B1}$, where $L_{XY}$ is the inductance of one corresponding segment of the RF routing transmission line; and Connection path RF,A1→RF,B4: The long RF line connection path connecting I/O nodes or ports RF,A1 to RF,B4 leads to a significantly higher inductance: $L_{A1}+4*L_{TLA1}+L_{TLB4,1}+L_{B4}$ (if all of the line inductances $L_{TLA1}$ have the same value).

The total inductance of an RF routing transmission line can be in the order of ~0.8 nH to 1.0 nH in the case of a large switch such as a 4P4T cross-switch and is typically comparable to the inductance of the tuning inductors. The difference of the total inductance can easily surpass 600 pH for such a case.

This difference in matching of the different RF paths in cross-switch 100 can lead to insertion loss, isolation and return loss variation as well as degraded harmonics and breakdown performance for different paths of the switch.

Figure 1B:
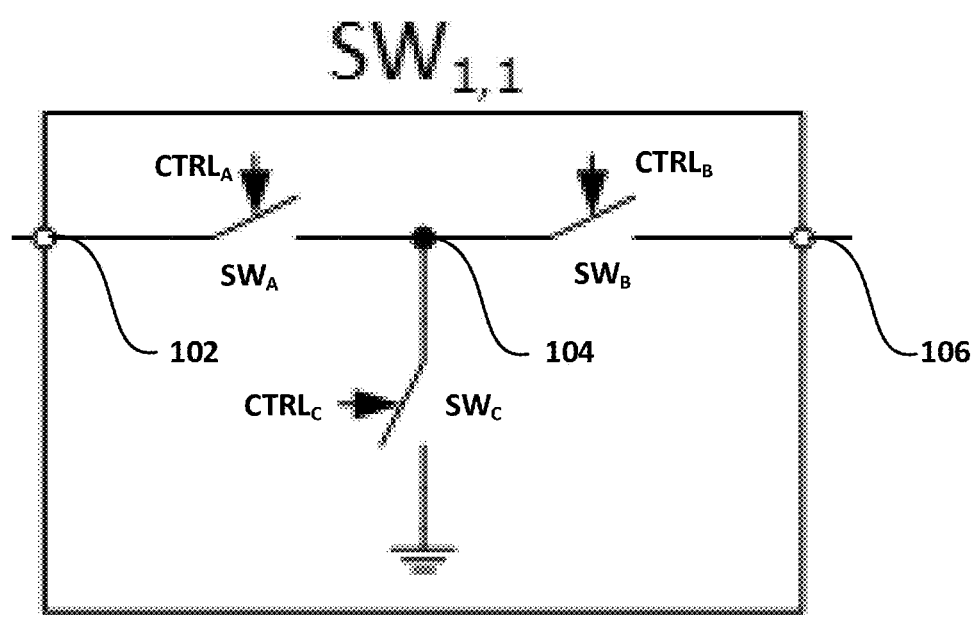
FIG. 1B is a schematic diagram of a switching cell used in the RF cross-switch of FIG. 1A.

A representative switch cell $SW_{1,1}$ for use in switch 100 is shown in FIG. 1B including a first node or "A" bus (or transmission line) node 102 and a second node or "B" bus (or transmission line) node 106. A first individual switch $SW_A$ is coupled between first node 102 and internal switch node 104. The first individual switch $SW_A$ is controlled by control signal $CTRL_A$, provided by, for example, a microprocessor or system controller not shown in FIG. 1B. A second individual switch $SW_B$ is coupled between internal switch node 104 and second node 106. The second individual switch $SW_B$ is controlled by control signal $CTRL_B$, also provided by, for example, a microprocessor or system controller not shown in FIG. 1B. A third individual switch $SW_C$ is coupled between internal switch node 104 and ground. The third individual switch $SW_C$ is controlled by control signal $CTRL_C$, also provided by, for example, a microprocessor or system controller not shown in FIG. 1B. Other embodiments of representative switch cell $SW_{1,1}$ can also be used in switch 100. For example, in FIG. 1C an "L-shaped" switch is shown in which individual switch $SW_A$ is removed and replaced with a short circuit connection. In the embodiment of FIG. 1D a simple individual switch $SW_A$ is coupled between switch nodes 102 and 106.

Figure 1C:
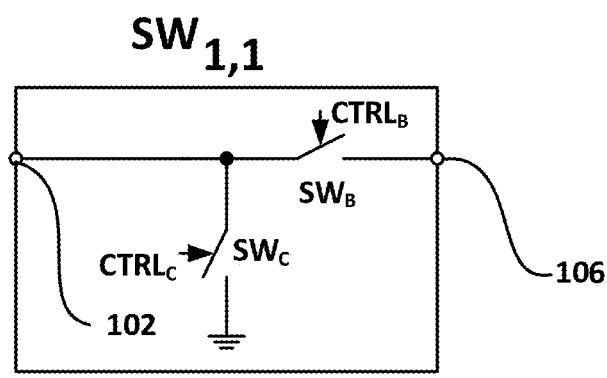
FIG. 1C is a schematic diagram of an alternative switching cell used in the RF cross-switch of FIG. 1A.
Figure 1D:
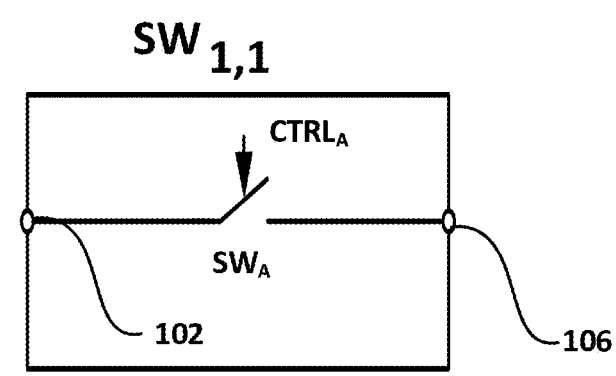
FIG. 1D is a schematic diagram of another alternative switching cell used in the RF cross-switch of FIG. 1A.
Figure 1E:
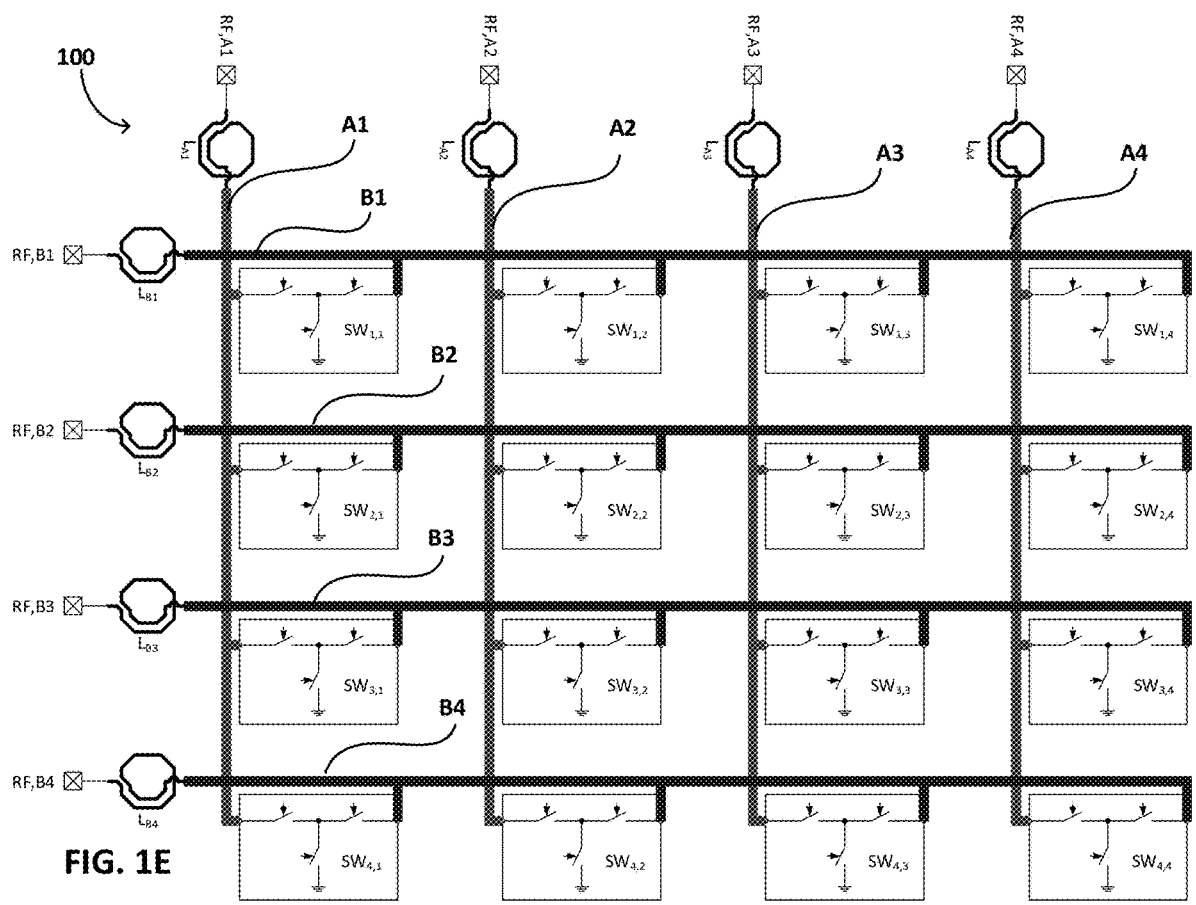
FIG. 1E is a combined schematic and layout diagram of the RF cross-switch of FIG. 1A.

FIG. 1E is a layout diagram of the RF cross-switch of FIG. 1A, wherein each of the tuning inductors $L_{A1}$, $L_{A2}$, $L_{A3}$, $L_{A4}$, and $L_{B1}$, $L_{B2}$, $L_{B3}$, $L_{B4}$, are shown as physical inductors, column transmission lines are shown as metal traces A1, A2, A3, and A4, and row transmission lines are shown as metal traces B1, B2, B3, and B4. The input/output nodes and switch cells are the same as previously shown in FIG. 1A.

Figure 1F:
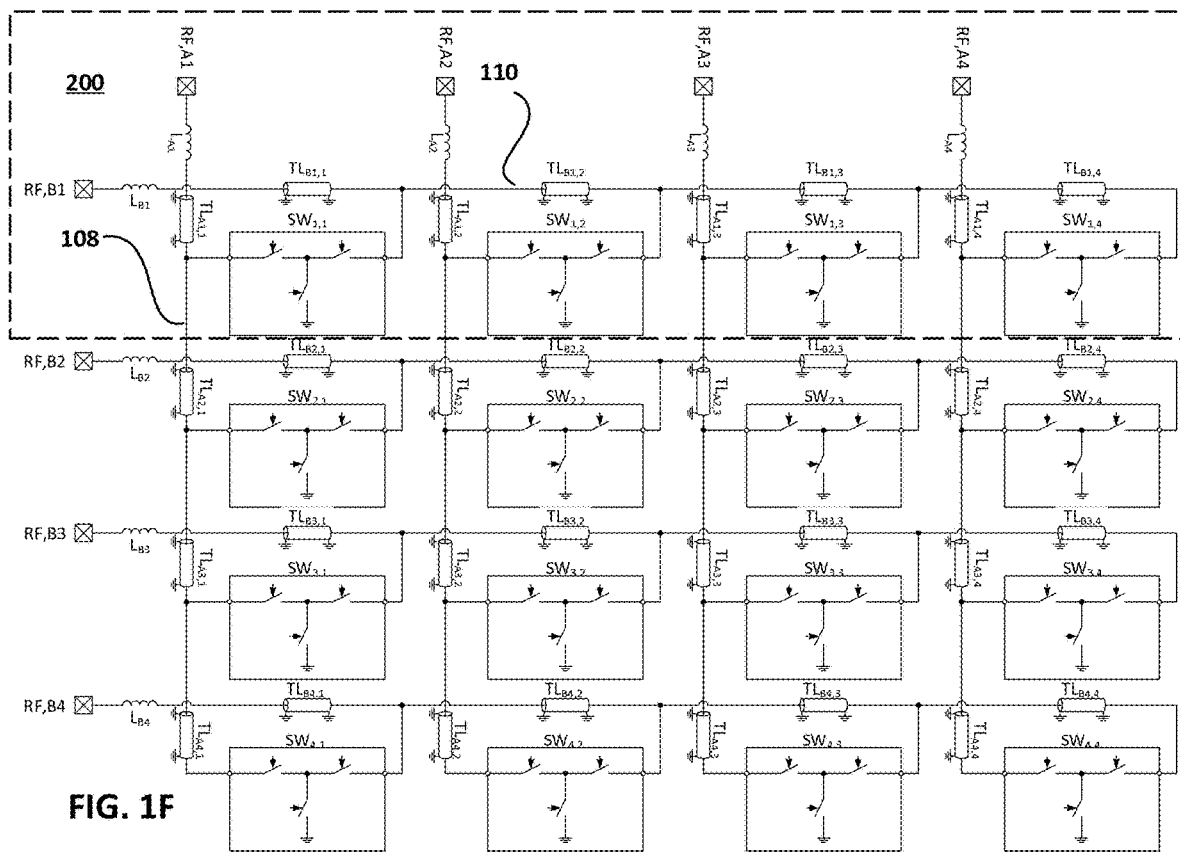
FIG. 1F is the schematic diagram of FIG. 1A further identifying a row portion of the RF cross-switch.

FIG. 1F is the schematic diagram of FIG. 1A, that further includes a highlighted cross-switch portion 200 comprising one row of individual switch cells. Cross-switch portion 200 is used for better explaining the exemplary cross-switch 100 and embodiments of a crosspoint switch or cross-switch with improved equalization of switch path impedance. Cross-switch portion 200 and the replacement branched structure for portion 200 according to some embodiments are described in further detail below with respect to FIGS. 2A through 2E.

Figure 2A:
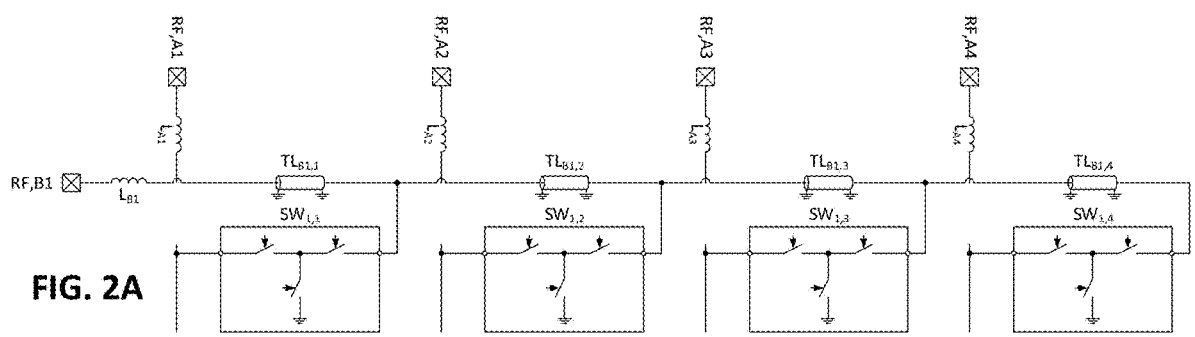
FIG. 2A is a schematic diagram of the row portion of the RF cross-switch of FIG. 1D.
Figure 2B:
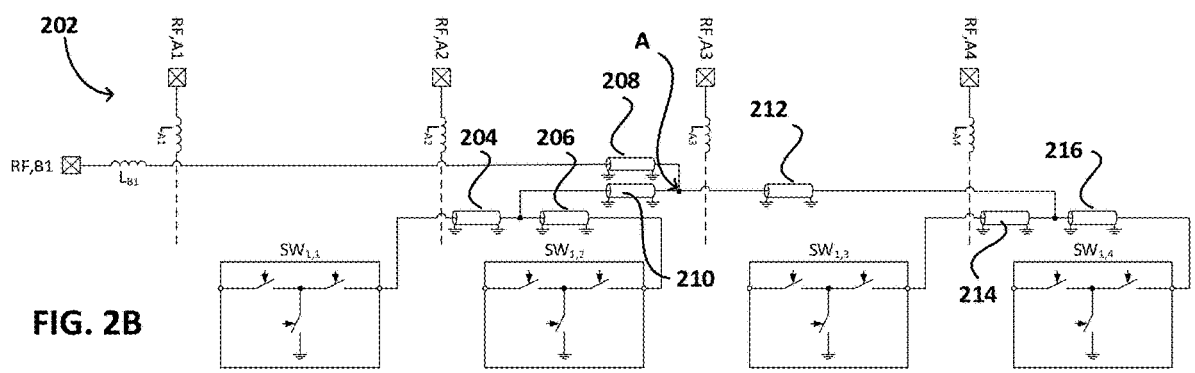
FIG. 2B is a schematic diagram of a portion of an RF cross-switch according to an embodiment.
Figure 2C:
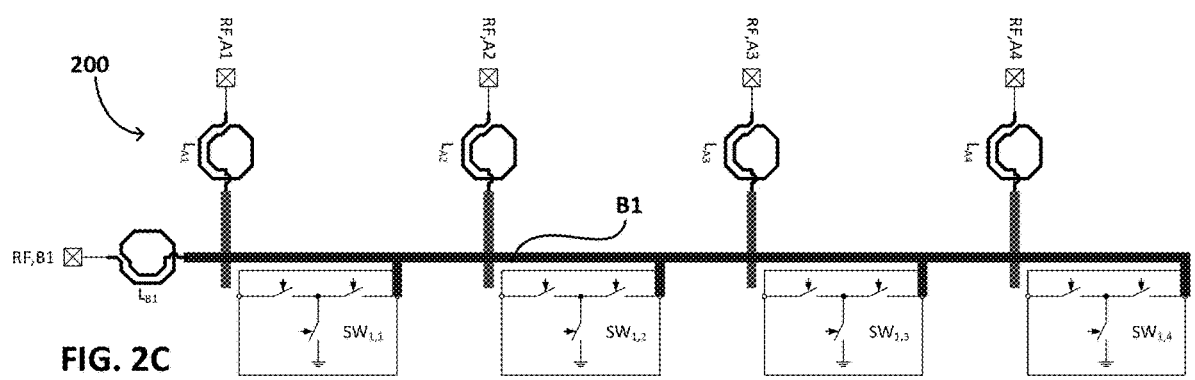
FIG. 2C is a combined schematic and layout diagram of the portion of the RF cross-switch of FIG. 1D.
Figure 2D:
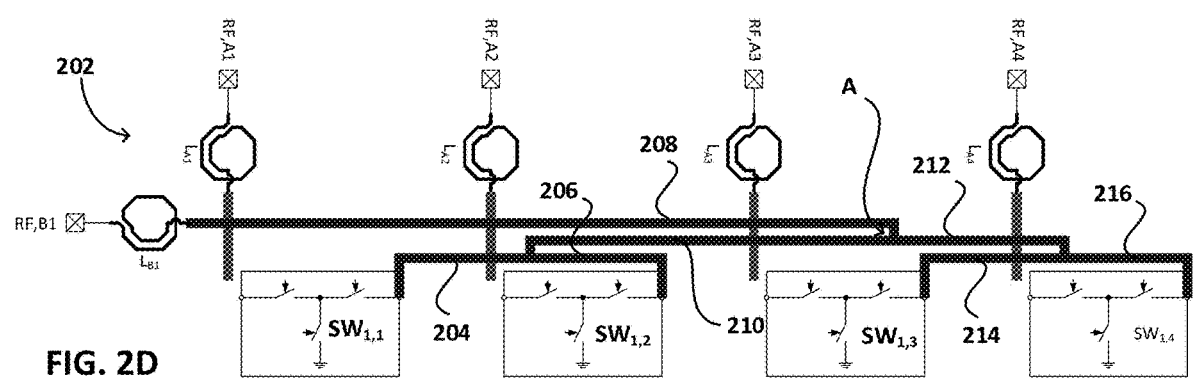
FIG. 2D is a combined schematic and layout diagram of a portion of an RF cross-switch according to an embodiment.
Figure 2E:
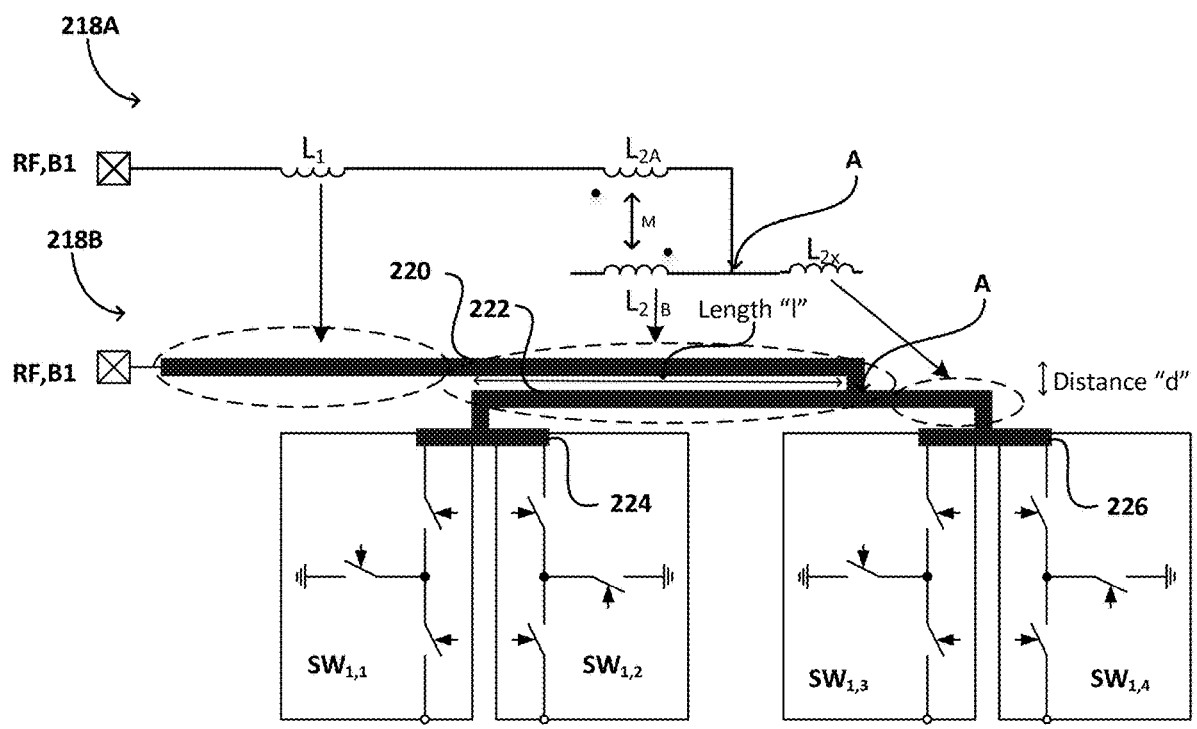
FIG. 2E is a combined schematic and layout diagram of a portion an RF cross-switch according to an embodiment.

In brief, FIG. 2A is a schematic diagram of a portion 200 of the RF cross-switch 100 of FIG. 1A; FIG. 2B is a schematic diagram of a portion 202 of an RF cross-switch according to an embodiment corresponding to portion 200 but using a branch structure transmission line instead of a straight transmission line; FIG. 2C is a layout diagram of a portion 200 of the RF cross-switch 100 of FIG. 1A; FIG. 2D is a layout diagram of a portion 202 an RF cross-switch according to an embodiment corresponding to portion 200 but using the branch structure transmission line instead of a straight transmission line; and FIG. 2E is a combined schematic and layout diagram of a portion 218A and 218B of an RF cross-switch according to an embodiment generally corresponding to portion 200 but show further details of the branched structure transmission line.

Instead of the straight transmission line RF connections as shown in FIGS. 1A and 1C an imbalanced branch structure is used (best seen in FIGS. 2B, 2D, and 2E and described in further detail below) to replace at least some of the straight transmission line RF connections. In embodiments, a particular transmission line may be kept straight when that particular switch branch does not need a particular equalization. In other embodiments, all of the transmission lines may be kept straight except one. In some embodiments, every transmission line of the cross-switch will be replaced by an imbalanced branch structure.

FIG. 2A is a schematic diagram of a portion 200 of the exemplary RF cross-switch of FIG. 1A showing a first row transmission line associated with I/O node RF,B1 including tuning inductor $L_{B1}$, transmission line elements $TL_{B1,1}$, $TL_{B1,2}$, $TL_{B1,3}$, and $TL_{B1,4}$, as well as switch cells $SW_{1,1}$, $SW_{1,2}$, $SW_{1,3}$, and $SW_{1,4}$. Also shown in FIG. 2A are I/O nodes RF,A1; RF,A2; RF,A3; and RF,A4 as well as corresponding tuning inductors $L_{A1}$, $L_{A2}$, $L_{A3}$, and $L_{A4}$.

FIG. 2B is a schematic diagram of a portion 202 an RF cross-switch according to an embodiment that replaces portion 200 shown in an embodiment cross-switch. While the I/O nodes, the tuning inductors, and the switch cells are similar to those in cross-switch portion 200 the row transmission line is different and shows the branched structure that will be described in further detail below. The row transmission line of portion 202 includes a first connection line including transmission line element 208. A second connection line includes transmission line elements 210 and 212. The first transmission line is connected to the second transmission line at internal connection point or node "A". A third connection line comprises transmission line elements 204 and 206 used to connect to switch cells $SW_{1,1}$ and $SW_{1,2}$, and a fourth connection line comprising transmission line elements 214 and 216 is used to connect to switch cells $SW_{1,3}$ and $SW_{1,4}$. Transmission line elements 208 and 210 comprise inductances that are in a mutual inductance configuration as is further shown and described with respect to FIGS. 2D and 2E. Transmission line elements 204, 206, 212, 214, and 216 comprise inductances that are self-inductances of a metal trace shown in further detail in FIGS. 2D and 2E.

FIG. 2C is a layout diagram of a portion 200 of the exemplary RF cross-switch of FIG. 1A showing the same components as FIG. 2A. However, these components are shown as physical layout elements. For example, the row transmission line is shown as a metal trace B1. The tuning inductors are shown as physical inductors as they would appear on a layout.

FIG. 2D is a layout diagram of a portion 202 of an RF cross-switch according to an embodiment showing the same components as FIG. 2B. However, these components are shown as physical layout elements. For example first, second, third and fourth connection lines are shown as including transmission line elements 204, 206, 208, 210, 212, 214, and 216 shown as portions of metal traces.

In an embodiment, further details of the transmission line branch structure can be seen in equivalent cross-switch portions (row transmission line) 218A and 218B in FIG. 2E. Cross-switch portion 218A is a branched transmission line in inductance schematic diagram form and generally corresponds to previously described cross-switch portion 202 of FIG. 2B. Cross-switch portion 218B is the same branched transmission line in layout diagram form and generally corresponds to previously described cross-switch portion 202 of FIG. 2D. A first branch of the branch structure includes a first connection line 220 coupled to I/O node RF,B1 including inductance $L_1$ and inductance $L_{2A}$. A second branch of the branch structure includes a second connection line 222 including inductance $L_{2B}$ and $L_{2X}$. A third branch of the branch structure include a third connection line 224 for connecting to switches $SW_{1,1}$ and $SW_{1,2}$. A fourth branch of the branch structure includes a fourth connection line 226 for connecting to switches $SW_{1,3}$ and $SW_{1,4}$. The first connection line and the second connection line are coupled together at internal connection point or node "A". Inductance $L_1$ is associated with the self-inductance of the first connection line 220, and inductance $L_{2X}$ is associated with the self-inductance of the second connection line 222. Inductance $L_{2A}$ and inductance $L_{2B}$ are in a mutual inductance configuration having a length "l" and an internal distance "d" separating the first connection line from the second connection line. The "dot convention" shows that inductance $L_{2A}$ and $L_{2B}$ are in an inverted mutual inductance configuration since the current flowing out of inductance $L_{2A}$ flows through connection point "A" and into inductance $L_{2B}$ in an embodiment as will be explained in further detail below. The inverted mutual inductance configuration described above creates a compensation effect that allows the inductance of the branch structure of cross-switch portion 218A to be equalized with other similar branch structures in the switch. The proper choice of the distance "d" between the RF connection lines, the length "l" of the mutual inductance configuration and thus the location of the connection point "A" allows tailoring of the inductance of both connection lines 220 and 222 by making use of the compensation effect due to the mutual inductance "M" of inductors $L_{2A}$ and $L_{2B}$.

The compensation effect of inductors $L_{2A}$ and $L_{2B}$ is needed to compensate the higher self-inductance of $L_{2A}+L_{2B}$ due to a longer length compared to inductors $L_{2A}$ and $L_{2X}$ (shorter length of the transmission lines). The compensation effect is generated when switches $SW_{1,1}$ and/or $SW_{1,2}$ are turned on and current is flowing into that particular branch.

Further details of the compensation effect are described below.

The voltage across an inductor L1 (for example inductor $L_{2A}$ in FIG. 2E) due to a current i1 in the presence of a second inductor L2 (for example inductor $L_{2B}$ in FIG. 2E) with a current i2 is:

$$V1=j*w*L1*i1+j*w*M*i2.$$

With M=k*sqrt(L1*L2) and the two currents i1 and i2 being equal, the impedance of L1 becomes:

$$Z1=j*w*(L1+k*\text{sqrt}(L1*L2)),$$

which for simple parallel lines (L1~L2) further simplifies to:

$$Z1=j*w*L1*(1+k)$$

with the opposite current direction "k" becomes negative, so that the effective inductance is reduced by a factor of 1−|k|, which provides the compensation effect.

Therefore, instead of using only a single common tuning inductor, such matching elements can be distributed as shown in FIG. 2E. The two inductors $L_1$ and $L_{2X}$ can be individually optimized to minimize insertion loss for each path separately as well as to equalize their performance. According to embodiments, each horizontal and vertical transmission line in a cross-switch may use a similar branch structure as is shown in FIG. 2E, moreover each branch structure may be slightly different to accommodate the exact cross-switch layout used.

As previously explained, inductance $L_1$ is associated with the self-inductance of the first connection line 220, and inductance $L_{2X}$ is associated with the self-inductance of the second connection line 222. Inductance $L_1$ and inductance $L_{2X}$ thus define a self-inductance portion of the entire transmission line. Inductance $L_{2A}$ and inductance $L_{2B}$ are in a mutual inductance configuration having a length "l" and an internal distance "d" separating the first connection line from the second connection line. Inductance $L_{2A}$ and inductance $L_{2B}$ thus define a mutual inductance portion of the entire transmission line. A first transmission line may be referred to as having a first self-inductance portion and a first mutual inductance portion. A second transmission line may be referred to as having a second self-inductance portion and a second mutual inductance portion.

Figure 3:
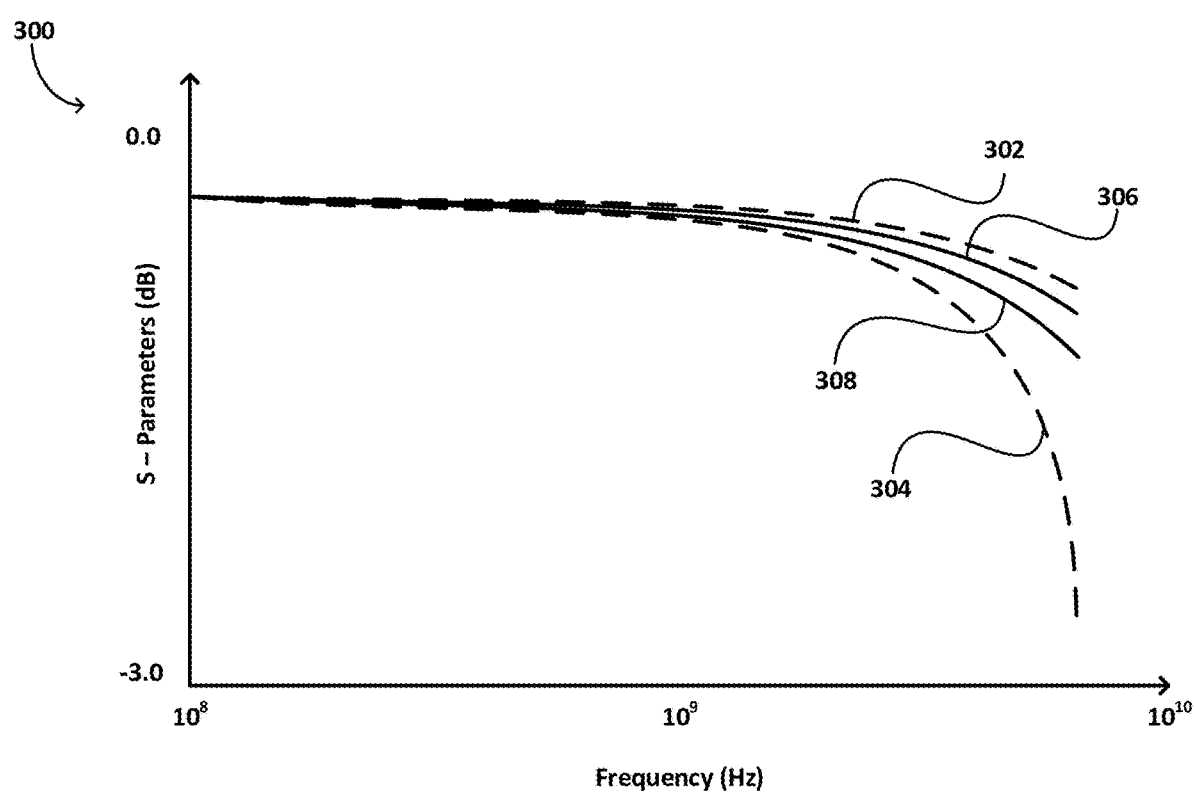
FIG. 3 is a plot of the insertion loss performance over frequency of an RF cross-switch compared to the performance of an exemplary RF cross-switch.

Adopting the above embodiment concepts allows for a significant improvement of all relevant RF performance parameters on the worst performing paths in larger switch matrices, although it is not limited to those cases. FIG. 3 illustrates a graph 300 of s-parameters versus frequency.

Traces 302, 304, 306 and 308 each represent the insertion loss (S21) of various traces. FIG. 3 shows the insertion loss improvement (in dB versus frequency) as an example: although a small penalty imposed on the best performing path is accepted, the improvement of the worst case path is large. FIG. 3 shows the best performing path 302 and the worst performing path 304 in an exemplary cross-switch. FIG. 3 also shows the best performing path 306 and the worst performing path 308 in an embodiment cross-switch. Note that the difference in dB between the frequency performance of paths 306 and 308 in the embodiment cross-switch is less than the difference in dB between the frequency performance of paths 302 and 304 of the exemplary cross-switch. The specific values depicted in FIG. 3 are only an example and may change for a particular cross-switch embodiment. However, all cross-switch embodiments will show an improvement in the equalization between the best performing path and the worst performing path relative to the exemplary cross-switch.

The cross-switch may use individual tuning inductors in conjunction with the branched structures for further improvements in path equalization and for greater flexibility in the design of the cross-switch. Cross-switch embodiments using individual tuning inductors are shown and described below with reference to FIG. 4 (one tuning inductor), FIG. 5 (two tuning inductors), and FIG. 6 (three tuning inductors).

Figure 4:
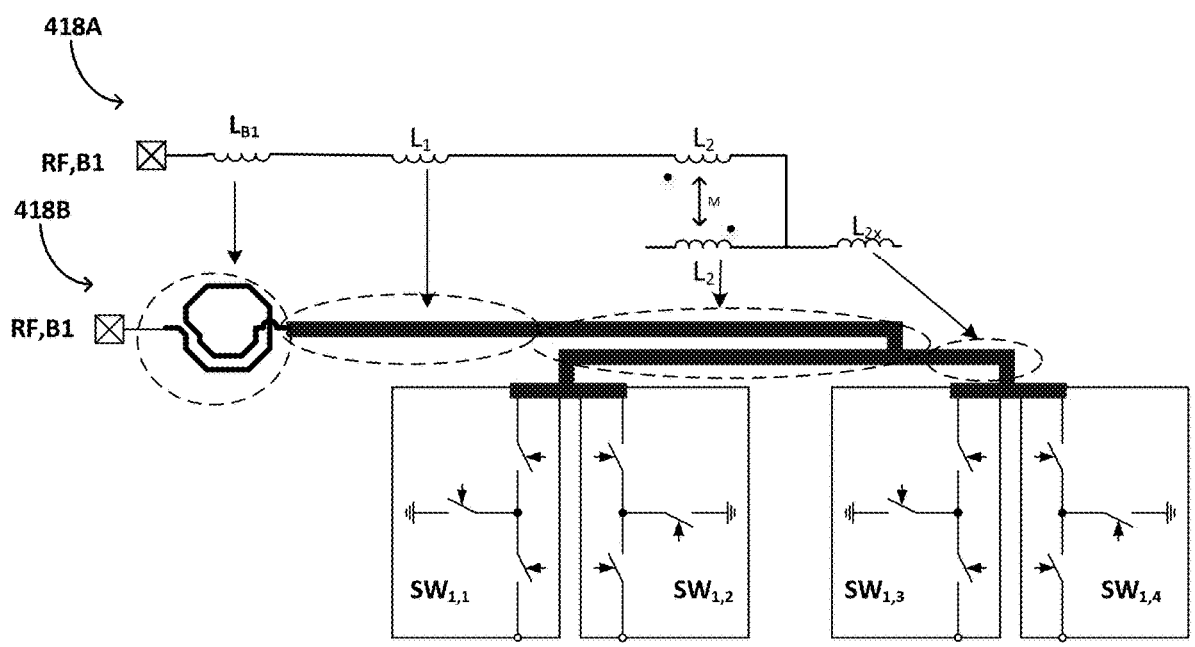
FIG. 4 is a combined schematic and layout diagram of a portion an RF cross-switch according to an embodiment including a single common tuning inductor.

FIG. 4 is a combined schematic and layout diagram of a branched structure portion of an RF cross-switch according to an embodiment including a single tuning inductor. Portion 418A is in schematic diagram form and corresponds to portion 218A previously shown in FIG. 2E, except for the addition of a tuning inductor $L_{B1}$ in series with inductance $L_1$. Portion 418B is in layout diagram form and corresponds to portion 218B previously shown in FIG. 2E, except for the addition of the tuning inductor $L_{B1}$. Tuning inductor $L_{B1}$ can also be used to further adjust the impedance characteristics of branched structure portion 418A.

Figure 5:
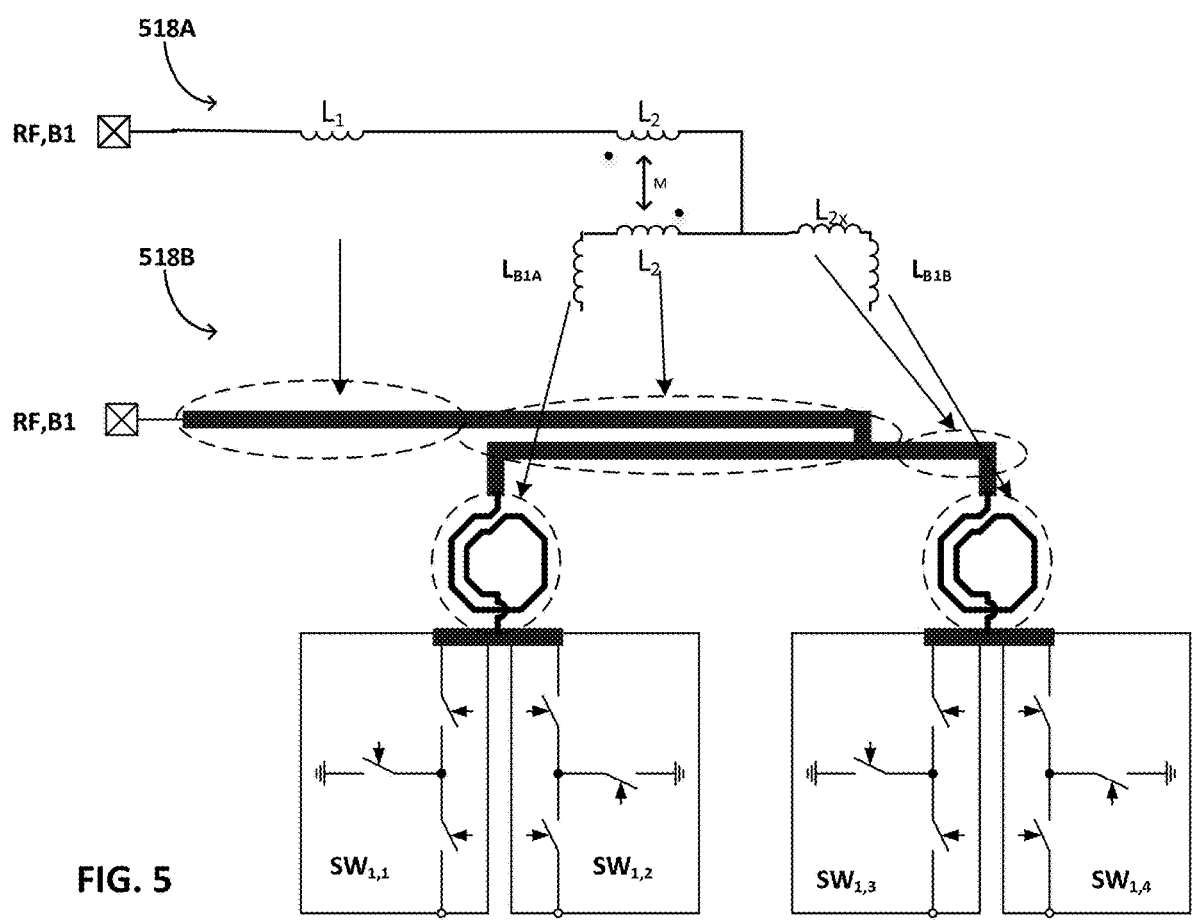
FIG. 5 is a combined schematic and layout diagram of a portion an RF cross-switch according to an embodiment including a single path specific tuning inductor.

FIG. 5 is a combined schematic and layout diagram of a branched structure portion of an RF cross-switch according to an embodiment including two tuning inductors. Portion 518A is in schematic diagram form and corresponds to portion 218A previously shown in FIG. 2E, except for the addition of two additional tuning inductors $L_{B1A}$ and $L_{B1B}$ in series with inductances $L_2$ and $L_{2X}$. Portion 518B is in layout diagram form and corresponds to portion 218B previously shown in FIG. 2E, except for the addition of the tuning inductors $L_{B1A}$ and $L_{B1B}$. Tuning inductors $L_{B1A}$ and $L_{B1B}$ can also be used to further adjust the impedance characteristics of branched structure portion 518A.

Figure 6:
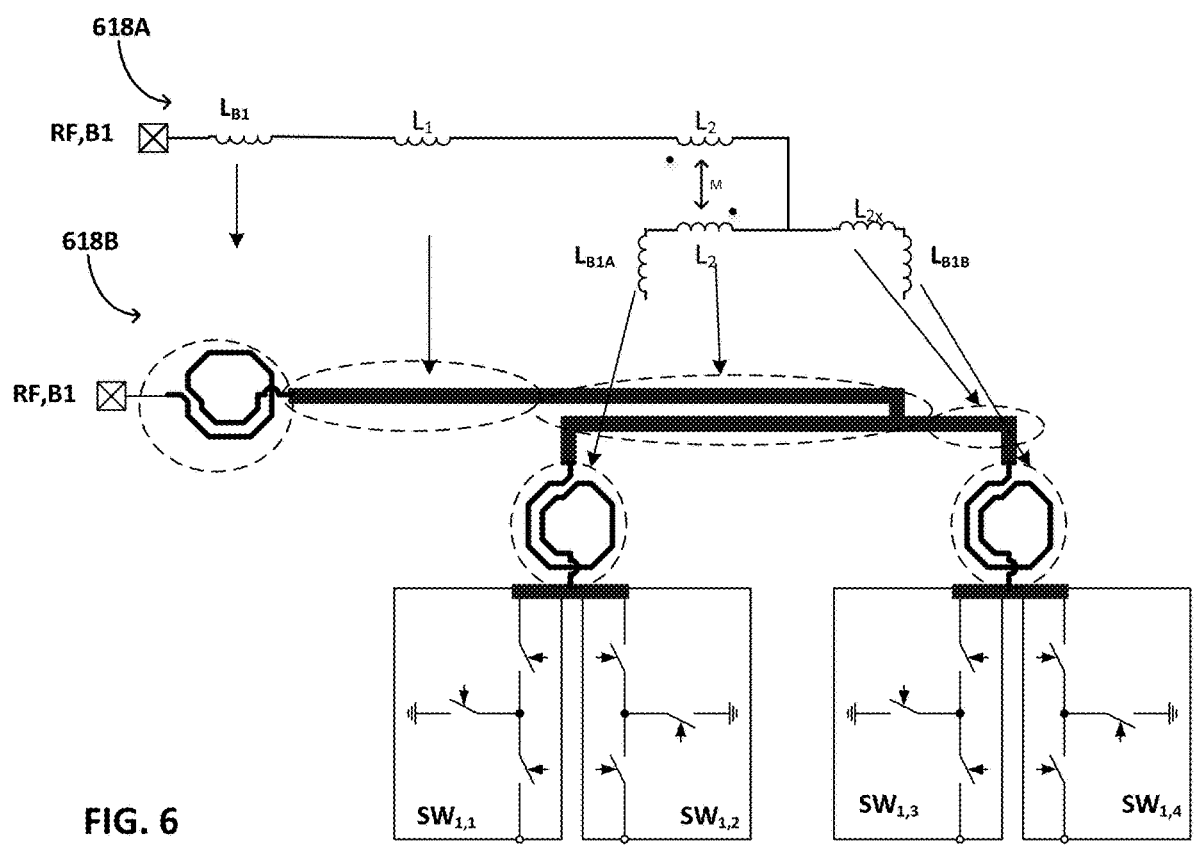
FIG. 6 is a combined schematic and layout diagram of a portion an RF cross-switch according to an embodiment including a single common tuning inductor and a path specific tuning inductor.

FIG. 6 is a combined schematic and layout diagram of a portion an RF cross-switch according to an embodiment including three tuning inductors, combining the tuning inductors shown in FIGS. 4 and 5. Portion 618A is in schematic diagram form and corresponds to portion 218A previously shown in FIG. 2E, except for the addition of three additional tuning inductors $L_{B1}$, $L_{B1A}$, and $L_{B1B}$. Portion 618B is in layout diagram form and corresponds to portion 218B previously shown in FIG. 2E, except for the addition of three additional tuning inductors $L_{B1}$, $L_{B1A}$, and $L_{B1B}$. Tuning inductors $L_{B1}$, $L_{B1A}$, and $L_{B1B}$ can also be used to further adjust the impedance characteristics of branched structure portion 518A.

Thus, a cross-switch has been described having a plurality of branched structure transmission lines for coupling to rows and columns of switch cells. In a 4P4T cross-switch, for example, four branched structure transmission lines are used for coupling to four columns of switch cells, and four branched structure transmission lines are used for coupling to four rows of switch cells. It will be apparent to those skilled in the art that design of the branched structure transmission lines will be highly dependent upon the layout of the cross-switch. The placement of the input/output pads, the placement and layout design of the switch cells, the placement of other pads such as one or more grounds pads, as well as other layout considerations, will determine the design of the branched structure transmission lines. In some embodiments, not all branched structure transmission lines will necessarily have the same layout. In some embodiments, some of the branched structure transmission lines may be identical, however, and some may be symmetrical with respect to each other. In other embodiments, some of the branched structure transmission may include tuning inductances and others may not. The branched structure transmission lines include several design factor options so that the total impedance of each transmission line can be substantially equalized, including: the use of zero to three or more tuning inductors; the length of self-inductance portions of the first and second connection lines; the length of the mutual inductance configuration; and the internal distance between the first and second connection lines that determines the mutual inductance and thus the compensation factor previously discussed.

Figure 7:
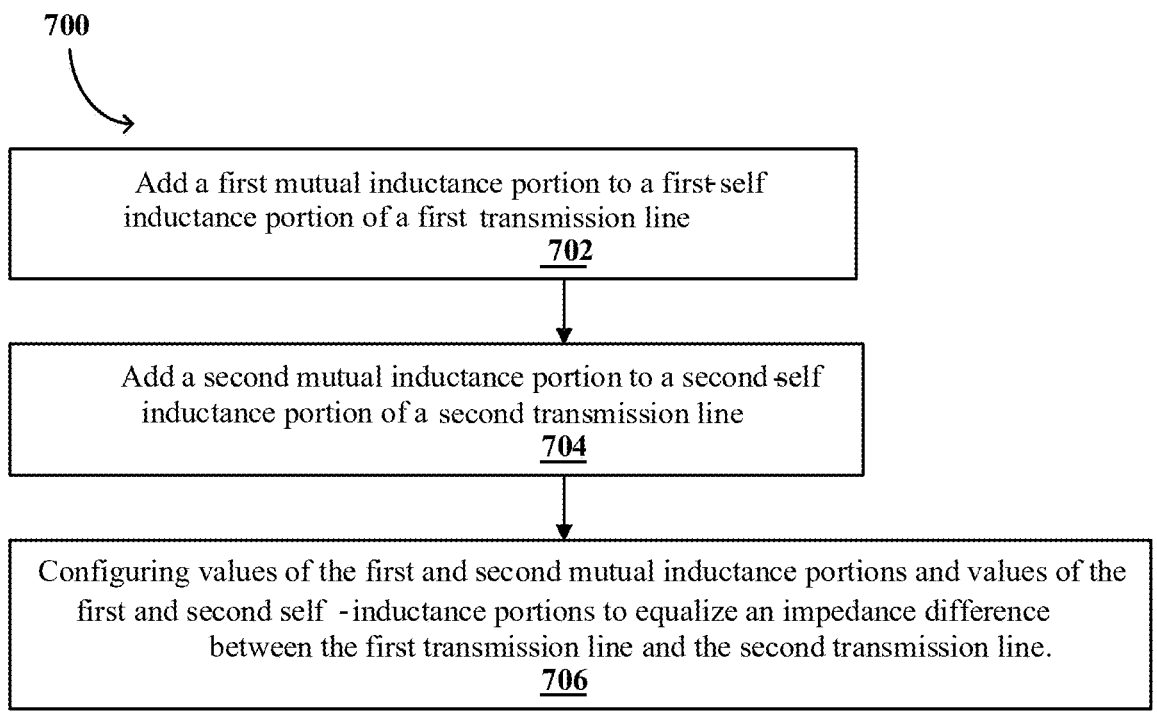
FIG. 7 illustrates a flow chart for an embodiment method of equalizing the paths impedance of an RF cross-switch.

FIG. 7 illustrates a flow chart for an embodiment method 700 of manufacturing an RF switch, the method comprising adding a first mutual inductance portion to a first self-inductance portion of a first transmission line at step 702; adding a second mutual inductance portion to a second self-inductance portion of a second transmission line at step 704; and adjusting values of the first and second mutual inductance portions and values of the first and second self-inductance portions to equalize an impedance difference between the first transmission line and the second transmission line at step 706. In the embodiment manufacturing method 700, adjusting values of the first and second mutual inductance portions can comprise adjusting respective lengths of the first and second mutual inductance portions or comprise adjusting respective internal distances of the first and second mutual inductance portions. In the embodiment manufacturing method 700, adjusting values of the first and second self-inductance portions can comprise adjusting respective lengths of the first and second self-inductance portions. In the embodiment manufacturing method 700, adding the first mutual inductance portion to the first self-inductance portion of the first transmission line comprises adding first and second parallel connection lines to the first transmission line. Similarly, adding the second mutual inductance portion to the second self-inductance portion of the second transmission line can comprise adding first and second parallel connection lines to the second transmission line.

Embodiment cross-switches can be implemented using different package types that provide the necessary number of wiring layers. Embodiment cross-switches can also be implemented using an on-chip (integrated circuit) implementation using different semiconductor processes using multiple wiring layers.

It is an advantage of cross-switch embodiments described herein, that moving from a single element matching to a distributed LC matching allows separate matching of each and every switch path resulting in a switch product having a more balanced RF-performance.

Example 1. According to an embodiment, a method of manufacturing an RF switch includes adding a first mutual inductance portion to a first self-inductance portion of a first transmission line; and adding a second mutual inductance portion to a second self-inductance portion of a second transmission line, wherein values of the first and second mutual inductance portions and values of the first and second self-inductance portions are configured to equalize an impedance difference between the first transmission line and the second transmission line.

Example 2. The method of Example 1, wherein configuring values of the first and second mutual inductance portions comprises configuring respective lengths of the first and second mutual inductance portions.

Example 3. The method of any of the previous examples, wherein configuring values of the first and second mutual inductance portions comprises configuring respective internal distances of the first and second mutual inductance portions.

Example 4. The method of any of the previous examples, wherein configuring values of the first and second self-inductance portions comprises configuring respective lengths of the first and second self-inductance portions.

Example 5. The method of any of the previous examples, wherein configuring the first mutual inductance portion to the first self-inductance portion of the first transmission line comprises adding first and second parallel connection lines to the first transmission line.

Example 6. The method of any of the previous examples, wherein adding the second mutual inductance portion to the second self-inductance portion of the second transmission line comprises adding first and second parallel connection lines to the second transmission line.

Example 7. A transmission line for an RF switch, the transmission line including a first connection line comprising first and second inductance portions, wherein the first connection line is connected between a first node and an internal node; and a second connection line comprising third and fourth inductance portions, wherein the third inductance portion is connected between the internal node and a second node, and wherein the fourth inductance portion is connected between the internal node and a third node, and wherein the second inductance portion of the first connection line and the third inductance portion of the second connection line are in a mutual inductance configuration.

Example 8. The transmission line of Example 7, wherein the mutual inductance configuration is configured to compensate for at least a portion of a total inductance of the first connection line and to compensate for at least a portion of a total inductance of the second connection line.

Example 9. The transmission line of any of the previous examples, wherein the first connection line is parallel to the second connection line.

Example 10. The transmission line of any of the previous examples, further comprising a tuning inductor coupled to at least one of the first, second, or third nodes.

Example 11. The transmission line of any of the previous examples, further comprising at least one switch cell coupled to the second node.

Example 12. The transmission line of any of the previous examples, further comprising at least one switch cell coupled to the third node.

Example 13. An RF switch including a plurality of switch cells arranged in a plurality of rows and a plurality of columns, wherein each switch cell comprises a first node and a second node; a first plurality of transmission lines respectively coupled to the first nodes in the plurality of columns of switch cells; and a second plurality of transmission lines respectively coupled to the second nodes in the plurality of rows of switch cells, wherein each of the first plurality of transmission lines comprises self-inductance and mutual inductance portions, wherein each of the second plurality of transmission lines comprises self-inductance and mutual inductance portions, and wherein values of the self-inductance and mutual inductance portions are configured to equalize an impedance of each of the first and second plurality of transmission lines.

Example 14. The RF switch of Example 13, wherein an individual mutual inductance portion comprises first and second parallel connection lines.

Example 15. The RF switch of any of the previous examples, wherein a value of the individual mutual inductance portion is determined by a length of the individual mutual inductance portion.

Example 16. The RF switch of any of the previous examples, wherein a value of the individual mutual inductance portion is determined by a distance between the first and second parallel connection lines.

Example 17. The RF switch of any of the previous examples, wherein the first connection line further comprises a tuning inductor.

Example 18. The RF switch of any of the previous examples, wherein the second connection line further comprises at least one tuning inductor.

Example 19. The RF switch of any of the previous examples, comprising a four-pole, four-throw RF switch.

Example 20. The RF switch of any of the previous examples, wherein each switch cell comprises a plurality of individual switches.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of manufacturing an RF switch, the method comprising:
adding a first mutual inductance portion to a first self-inductance portion of a first transmission line; and
adding a second mutual inductance portion to a second self-inductance portion of a second transmission line,
wherein values of the first and second mutual inductance portions and values of the first and second self-inductance portions are configured to equalize an impedance difference between the first transmission line and the second transmission line.

2. The method of claim 1, wherein configuring values of the first and second mutual inductance portions comprises configuring respective lengths of the first and second mutual inductance portions.

3. The method of claim 1, wherein configuring values of the first and second mutual inductance portions comprises configuring respective internal distances of the first and second mutual inductance portions.

4. The method of claim 1, wherein configuring values of the first and second self-inductance portions comprises configuring respective lengths of the first and second self-inductance portions.

5. The method of claim 1, wherein configuring the first mutual inductance portion to the first self-inductance portion of the first transmission line comprises adding first and second parallel connection lines to the first transmission line.

6. The method of claim 1, wherein adding the second mutual inductance portion to the second self-inductance portion of the second transmission line comprises adding first and second parallel connection lines to the second transmission line.

7. A transmission line for an RF switch, the transmission line comprising:
- a first connection line comprising first and second inductance portions, wherein the first connection line is connected between a first node and an internal node; and
- a second connection line comprising third and fourth inductance portions, wherein the third inductance portion is connected between the internal node and a second node, and wherein the fourth inductance portion is connected between the internal node and a third node, and
- wherein the second inductance portion of the first connection line and the third inductance portion of the second connection line are in a mutual inductance configuration, and wherein the mutual inductance configuration is configured to compensate for at least a portion of a total inductance of the first connection line and to compensate for at least a portion of a total inductance of the second connection line.

8. The transmission line of claim 7, wherein the first connection line is parallel to the second connection line.

9. The transmission line of claim 7, further comprising a tuning inductor coupled to at least one of the first, second, or third nodes.

10. The transmission line of claim 7, further comprising at least one switch cell coupled to the second node.

11. The transmission line of claim 7, further comprising at least one switch cell coupled to the third node.

12. An RF switch comprising:
- a plurality of switch cells arranged in a plurality of rows and a plurality of columns, wherein each switch cell comprises a first node and a second node;
- a first plurality of transmission lines respectively coupled to the first nodes in the plurality of columns of switch cells; and
- a second plurality of transmission lines respectively coupled to the second nodes in the plurality of rows of switch cells,
- wherein each of the first plurality of transmission lines comprises self-inductance and mutual inductance portions, wherein each of the second plurality of transmission lines comprises self-inductance and mutual inductance portions, and wherein values of the self-inductance and mutual inductance portions are configured to equalize an impedance of each of the first and second plurality of transmission lines.

13. The RF switch of claim 12, wherein an individual mutual inductance portion comprises first and second parallel connection lines.

14. The RF switch of claim 13, wherein a value of the individual mutual inductance portion is determined by a length of the individual mutual inductance portion.

15. The RF switch of claim 13, wherein a value of the individual mutual inductance portion is determined by a distance between the first and second parallel connection lines.

16. The RF switch of claim 13, wherein the first connection line further comprises a tuning inductor.

17. The RF switch of claim 13, wherein the second connection line further comprises at least one tuning inductor.

18. The RF switch of claim 12, comprising a four-pole, four-throw RF switch.

19. The RF switch of claim 12, wherein each switch cell comprises a plurality of individual switches.

* * * * *